(12) United States Patent
Rudberg et al.

(10) Patent No.: US 7,378,998 B2
(45) Date of Patent: May 27, 2008

(54) CORRECTION OF STATIC MISMATCH ERRORS IN A D/A CONVERTER

(75) Inventors: Mikael Rudberg, Vikingstad (SE); Jan-Erik Eklund, Linkoeping (SE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/548,486

(22) Filed: Oct. 11, 2006

(65) Prior Publication Data

US 2007/0132616 A1 Jun. 14, 2007

(30) Foreign Application Priority Data

Oct. 11, 2005 (EP) ................................. 05022150

(51) Int. Cl.
*H03M 1/06* (2006.01)

(52) U.S. Cl. ................ 341/118; 341/120; 341/144; 341/145

(58) Field of Classification Search .................... None
See application file for complete search history.

(56) References Cited

U.S. PATENT DOCUMENTS

| 4,412,208 | A | * | 10/1983 | Akazawa et al. ........... 341/145 |
| 4,503,421 | A | | 3/1985 | Hareyama et al. |
| 4,567,463 | A | * | 1/1986 | Naylor ....................... 341/118 |
| 4,868,571 | A | * | 9/1989 | Inamasu ..................... 341/118 |
| 4,963,870 | A | | 10/1990 | Obinata |
| 4,975,699 | A | * | 12/1990 | Frey .......................... 341/118 |
| 5,017,918 | A | * | 5/1991 | Matsusako ................ 341/118 |
| 6,489,911 | B1 | | 12/2002 | O'Dwyer |
| 6,897,794 | B2 | * | 5/2005 | Kuyel et al. ............... 341/120 |
| 7,183,958 | B2 | * | 2/2007 | Quilligan et al. .......... 341/144 |

OTHER PUBLICATIONS

European Patent Office Search Report dated Feb. 24, 2006, (3 pages).

* cited by examiner

*Primary Examiner*—Khai M. Nguyen
(74) *Attorney, Agent, or Firm*—Patterson & Sheridan, L.L.P.

(57) ABSTRACT

Methods, articles of manufacture and systems for the correction of static mismatch errors in D/A converters, where an input word, being the digital representation of an analog input signal, is divided into one most significant part, msb-word, and one least significant part, lsb-word, where msb-word is represented by msb-bits and lsb-word is represented by lsb-bits. Correction is performed by setting the effective weight of the least significant msb-bit to be less than the total sum of all lsb-bits, implementing a first look up table, LUT1, containing the most significant part of the error, so that a corrected msb-word, c-msb-word, would be equal to the msb-word plus a value in LUT1 representing the msb-word, and implementing a second look up table, LUT2, containing the least significant part of the error, so that a first corrected output, c1-output, would be equal to c-msb-word plus a value in LUT2 representing the c-msb-word added to the lsb-word.

39 Claims, 6 Drawing Sheets

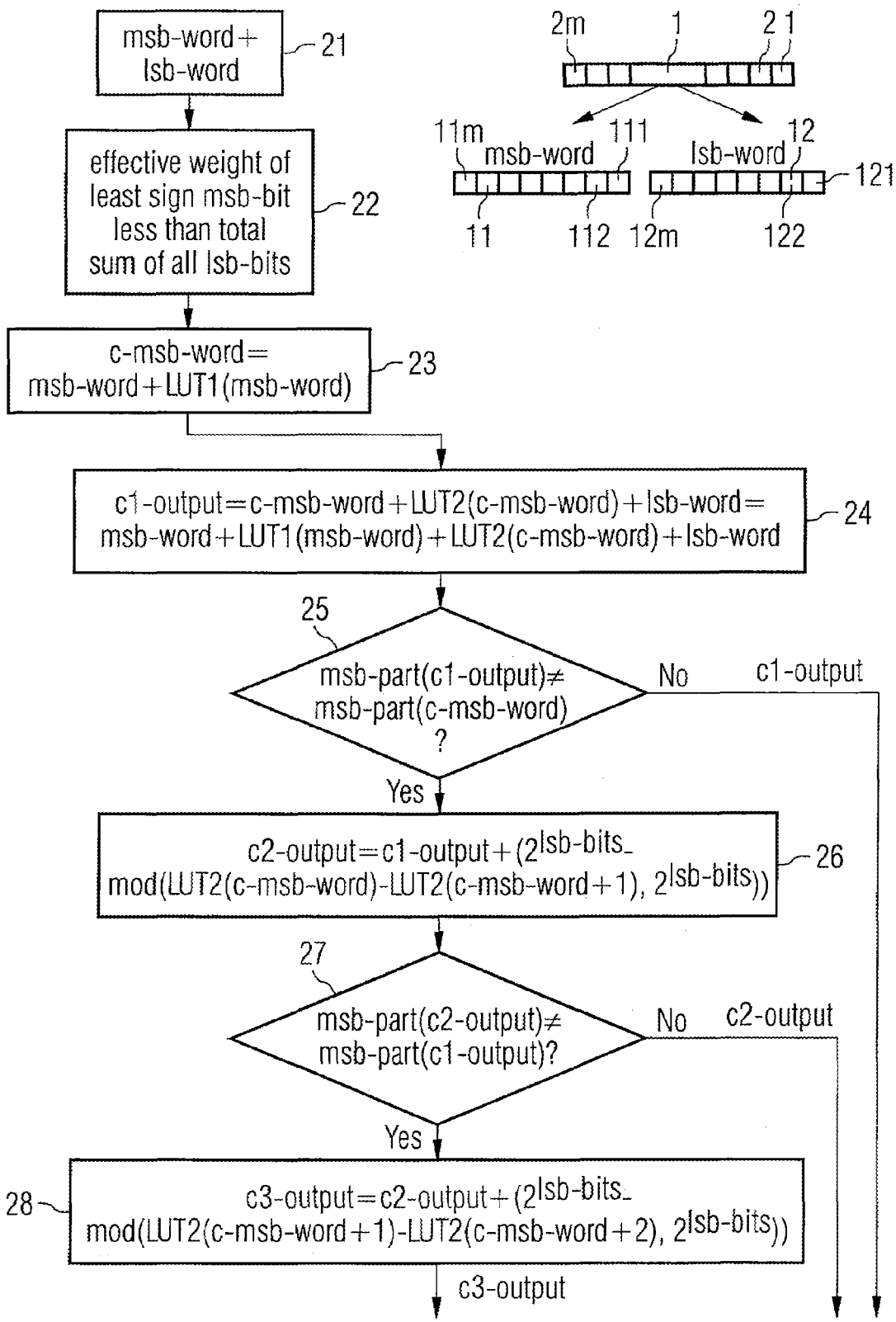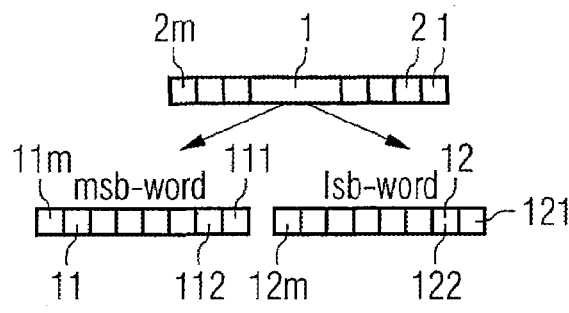

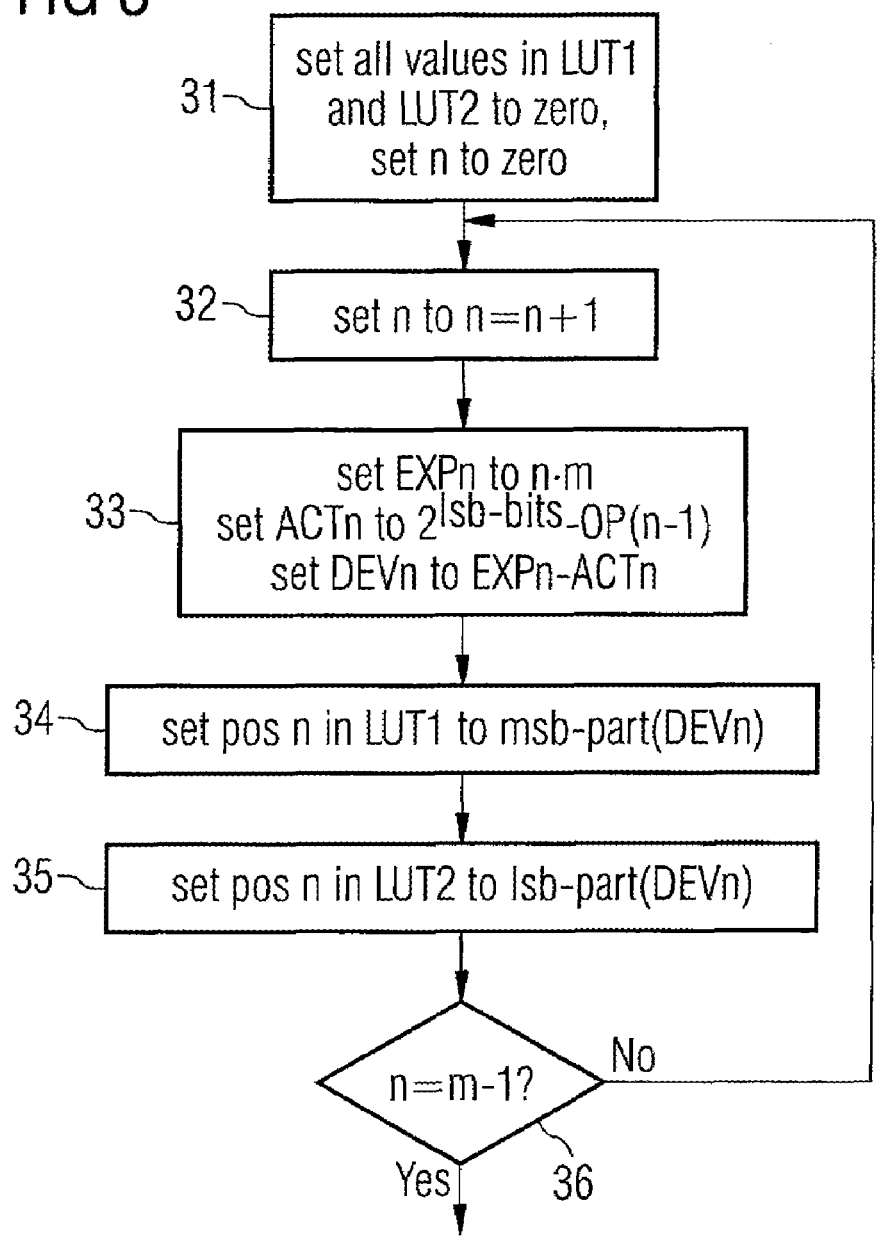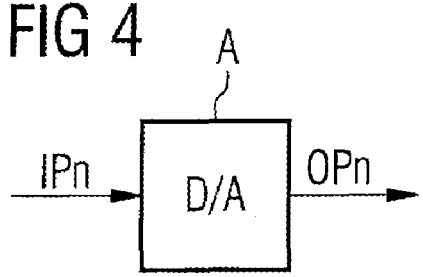

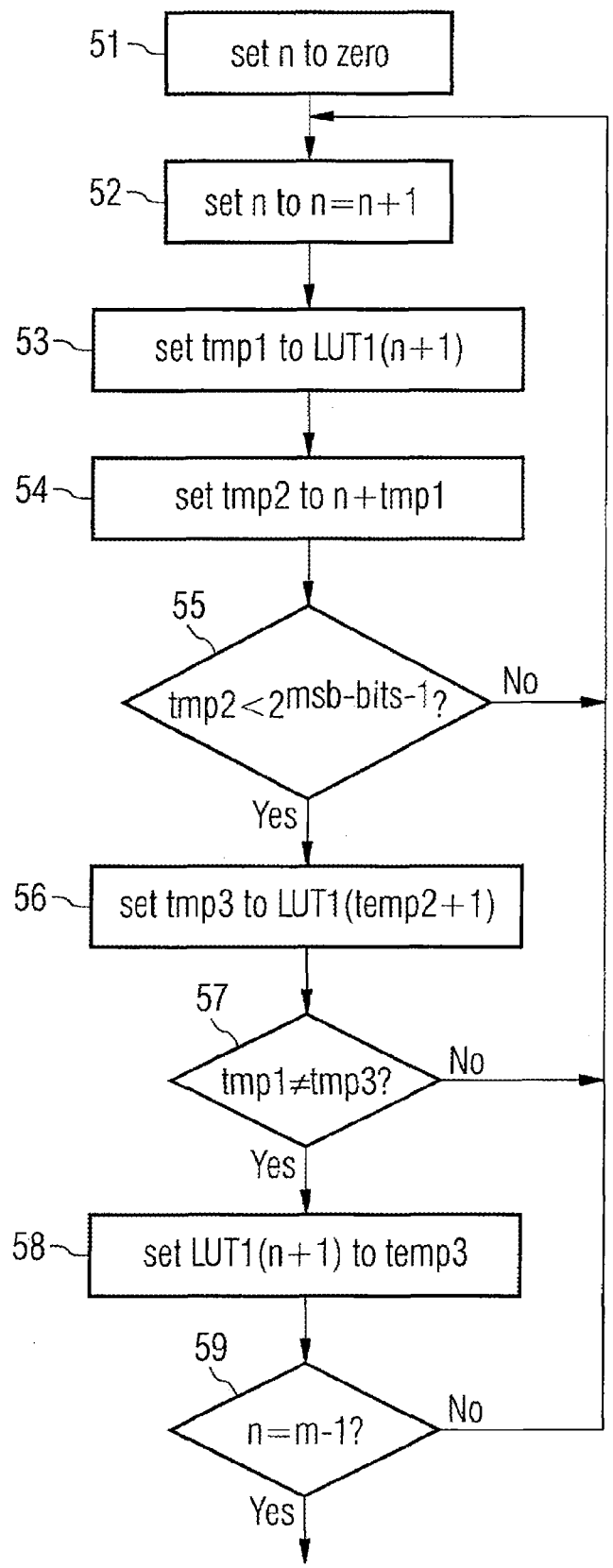

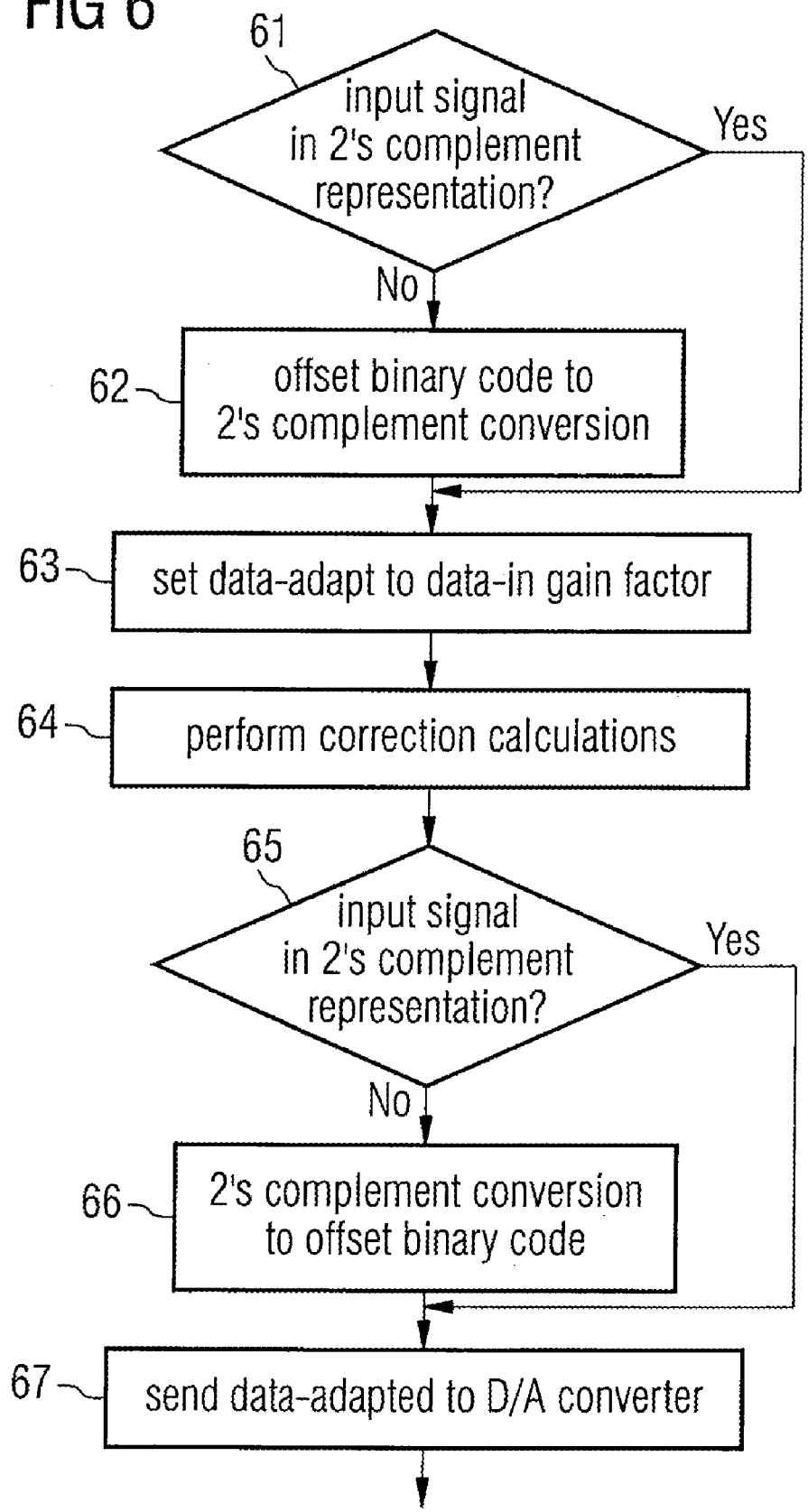

CORRECTION OF STATIC MISMATCH ERRORS IN A D/A CONVERTER

CROSS-REFERENCE TO RELATED APPLICATIONS

This application claims foreign priority benefits under 35 U.S.C. §119 to co-pending European patent application number EP 05 022 150.6, filed 11 Oct. 2005. This related patent application is herein incorporated by reference in its entirety.

BACKGROUND OF THE INVENTION

1. Field of the Invention

The present invention relates to a method, device, computer program products and a computer readable medium for the correction of static mismatch errors in a D/A converter.

2. Description of the Related Art

Embodiments of the invention relate to methods, devices, computer program products and computer readable media for the correction of static mismatch errors in a D/A (digital-to-analog) converter, where an input word, being the digital representation of an analog input signal, may be divided into one most significant part, a msb-word, and one least significant part, a lsb-word, and where said msb-word may be represented by msb-bits and said lsb-word may be represented by lsb-bits.

The D/A converters (DACs) of interest to embodiments of the invention include the ones that can be referred to as Nyquist converters. In these DACs the output signal typically is created by switching currents between a differential output pair (so called current steering DACs). However the invention also applies to areas where the output signal is generated by switching capacitors or resistors.

The DACs are often divided into segments since the matching requirements between the current sources are higher for the most significant bits of the input word. Consider for instance the 8 most significant bits in a 16 bit converter that have a 1% error in the current. The resulting output current will be:

Out-current=$(2^8*0.01*msb$-code+$lsb$-code)*$lsb$-current which with the input $(2^{14}+30)$ corresponds to:

out-current=$(2^8*0.01*2^6+30)*lsb$-current~$(2^8*2^6+168)$ that is, the error is 138 lsbs.

But an error in the lsb is much more forgiving:

out-current=$(2^8*2^6+30*0.01)*lsb$-current~$(2^8*2^6+30.3)$ i.e. 0.3 lsb.

Since the lsb sources are less sensitive to errors the DACs are often divided into two or three banks (segments) with differently sized reference sources (current sources, resistors, capacitors).

It is known that many DAC suppliers apply various calibration steps at the reference sources; it is for instance known to perform laser trimming of the current sources in high performance DACs. However, it may be more preferable to make error corrections in the digital domain rather than the analog domain.

Accordingly, what is needed are improved methods, systems, and articles of manufacture to improve accuracy of static matching in a DAC.

SUMMARY OF THE INVENTION

The problem to be solved is to improve the accuracy of the msb-weighted references, i.e. the static matching, in a DAC.

A solution to the problem may be to perform the correction of the DAC sources purely in the digital domain which is easier than trying to correct analog references directly.

The present invention teaches the introduction of some redundancy in the representation by changing the weight of the MSB sources in a segmented DAC.

Consider a DAC with a segmentation of 8 msbs and 8 lsbs. In a conventional weighted DAC the output words may be created as $msb$-code*$2^8$+$lsb$-code, due to the difference in size of the references (e.g. current sources). With this coding there may be a unique input to output value mapping in the DAC. Embodiments of the invention introduce some redundancy by making the msb weight a little bit smaller. One possible example would be that the weight is changed from $2^8$ to 248 so that the output word is created as:

$msb$-code*248+$lsb$-code.

With this representation some output values may be created from two different input words. One example would be the output 252 which may be created by either

1*248+4 or

0*248+252.

The reason for this redundancy is that one msb may be worth less than the total sum of all available lsbs.

Consider that there is an error in the msb weight so that its weight is larger than the nominal value. As an example, assume that the msb weight in reality is 253. In the example the output value 252 was wanted. This may be possible by the input word

0*253+252.

This shows that even if there is an error in the msb it may be possible to find an input code that gives the right output value assuming that the real or effective msb weight is known. The effective msb weight may vary depending on the input code since a varying number of msb sources are active.

As long as the effective msb weight is below or equal to in this case 256 it may still be possible to find an input code that gives the right output code even with a deviation from the nominal value present. This may be possible, for example, if the effective weight is lower than the nominal one when using conventional weighting.

It may not be possible to create the output value 256 if an error in the weight causes the effective msb weight to be 257. The closest result is

1*257+0=257 or

0*257+255=255.

The term used for this kind of redundancy is sub ranging. The problem that the present invention deals with is how to re-calculate the input word to the DAC once the effective msb weights are known.

Embodiments of the invention teach that the input word may be calculated in different steps. First, the input word may be split into one lsb part, lsb-word, and one msb part, msb-word. The lsb-word may be represented with lsb-bits and the msb-word with msb-bits.

Two look-up tables may be implemented where LUT1 may contain the error in the msb-word of the input word with a given input word. Initially it may be assumed that lsb-word is zero since this needs special handling.

That is, the corrected msb-word, c-msb-word, may be given by:

$$c\text{-}msb\text{-word}=msb\text{-word}+\text{LUT1}(msb\text{-word})$$

The second LUT (LUT2) may contain the lsb part of the error such as the correct output, c1-output may be given as:

$$c1\text{-output}=c\text{-}msb\text{-word}+\text{LUT2}(c\text{-}msb\text{-word})=msb\text{-word}+\text{LUT1}(msb\text{-word})+\text{LUT2}(c\text{-}msb\text{-word}).$$

Note that c1-output may contain a non-zero lsb part even if the assumption here was that the input word had zero as lsb part.

The next step may be to take care of a non-zero lsb part in the input word. When the lsb-word is non-zero the natural thing may be to extend the above expression of c1-output to:

$$c1\text{-output}=c\text{-}msb\text{-word}+\text{LUT2}(c\text{-}msb\text{-word})+lsb\text{-word}.$$

However when the lsb part of the input and the correction part are added together (i.e. LUT2(c-msb-word)+lsb-word) an additional msb might be generated. This msb may be generated when the operation runs out of available range in the lsb-part, $2^{lsb\text{-}bits}-1$, when using conventional binary arithmetic. However, the weight of this additional msb might be something other than $2^{lsb\text{-}bits}$ since the weights intentionally may have been lowered and since it can be expected that they contain some weight error as well. Thus, since one msb may be added with the weight of $2^{lsb\text{-}bits}$, but only a msb weight that is somewhat lower is available, it is in reality required to add some additional lsbs to come up to the expected $2^{lsb\_bits}$.

In the above given example a newly generated msb may have the weight of 248 instead of the assumed 256. When a new msb is generated with the settings as in the example the output from the DA converter may only increase with 248 lsb instead of the assumed 256. The solution may then be to add another 8 lsbs to the corrected output word.

It is however a problem to calculate the weight of the additional msb. This may simply be done from the "full weight" $2^{lsb\text{-}bits}$ subtracting the difference between two adjacent positions in LUT2, adjacent since maximally one additional msb is generated, modulus the lsb-range. A corrected output may then be:

$$c2\text{-output}=c\text{-}msb\text{-word}+(2^{lsb\text{-}bits}-\text{mod}(\text{LUT2}(c\text{-}msb\text{-word})-\text{LUT2}(c\text{-}msb\text{-word}+1),\ 2^{lsb\text{-}bits}))+lsb\text{-word}$$

At some situations yet another msb may be generated by the expression for c2-output. Fortunately the same correction method described by above may be applied again. So when another msb is generated another adjustment gives the correction as:

$$c3\text{-output}=c\text{-}msb\text{-word}+(2^{lsb\text{-}bits}-\text{mod}(\text{LUT2}(c\text{-}msb\text{-word})-\text{LUT2}(c\text{-}msb\text{-word}+1),\ 2^{lsb\text{-}bits}))+$$
$$(2^{lsb\text{-}bits}-\text{mod}(\text{LUT2}(c\text{-}msb\text{-word}+1)-\text{LUT2}(c\text{-}msb\text{-word}+2),\ 2^{lsb\text{-}bits}))+lsb\_\text{word}$$

There are thus three different equations for c1-output, c2-output and c3-output, to apply. Which ones to use may be dependent on how msbs are generated. In a proposed implementation c1-output may be calculated first, it is then detected if msb is altered and in that case c2-output or even c3-output is calculated. The complete correction method is summarized below:

$$c\text{-}msb\text{-word}=msb\text{-word}+\text{LUT1}(msb\text{-word})$$

$$c1\text{-output}=msb\text{-word}+\text{LUT1}(msb\text{-word})+\text{LUT2}(c\text{-}msb\text{-word})+lsb\text{-word}.$$

if msb-part(c1-output)≠msb-part(c-msb-word) then $$c2\text{-output}=c1\text{-output}+(2^{lsb\text{-}bits}-\text{mod}(\text{LUT2}(c\text{-}msb\text{-word})-\text{LUT2}(c\text{-}msb\text{-word}+1),\ 2^{lsb\_bits}))$$

if msb-part(c2-output)≠msb-part(c1-output) then $$c3\text{-output}=c2\text{-output}+(2^{lsb\text{-}bits}-\text{mod}(\text{LUT2}(c\text{-}msb\text{-word}+1)-\text{LUT2}(c\text{-}msb\text{-word}+2),\ 2^{lsb\text{-}bits}))$$

The LUTs may be derived from carefully measuring the output of a D/A converter when applying a ramp at the input and for every value measure the output current. Below there is an example in Matlab how to create the LUTs from a measured weight deviation of each msb. In the example we assume that these values are available in some kind of on-chip fuses (in the example stored in variable fuse). Anyone with some HW experience can easily see how to convert this Matlab code to a hardware implementation.

```
% build LUT1 and LUT2 tables from fuses
ACT = 0; % stores actual msb weight
EXP = 0; % stores expected msb weight assuming full
         % weight of 2^lsb_bits
LUT1 = zeros(1,256); % this is the msb RAM
LUT2 = zeros(1,256); % this is the lsb ram
for ll=1:255
    EXP = ll * 256; % weights in a normal DAC array
    ACT = (2^lsb-bits - fuse(ll+1)) + ACT; %actual weight
    DEV = EXP - act; % calc error
    % extract 8 msb:s
    LUT1(ll+1) = get-msbs(DEV);
    % extract 8 lsbs
    LUT2(ll+1) = get-lsbs(DEV);
end
% update LUT1 one more time to save one memory access
%
for ll=1:255
    tmp1 = LUT1(ll+1);
    tmp2 = ll+tmp1;
    if tmp2 < (2^msb-bits-1) % overflow check
        tmp3 = LUT1(tmp2+1);
        if tmp1 ~= tmp3
            % update LUT1 with this difference
            LUT1(ll+1) = tmp3;
        end;
    end;
end;
```

Since the msb weights may be lower than the commonly used $2^{lsb\text{-}bits}$ the range is somewhat lower than when using conventional methods. The impact of this range reduction is very low, but an annoying clip effect might happen when the use apply full range input signals. One solution to this may be to scale the signal before the DAC. To avoid introducing a DC offset when doing gain scaling it may be performed on data in 2's complement representation. A DAC typically have an unsigned representation (offset binary code) as input. This conversion is easily done as an inversion of the most significant bit.

So the gain scale procedure may be:
offset binary code to 2's complement conversion (not needed if already in 2's complement representation)
data-out=data-in*gain
perform correction calculations as described in this invention
2's complement conversion to offset binary code (not needed if already in 2's complement representation)
send data to DAC.

A method, device or computer program product according to the present invention may provide the same effect as laser trimming, but with the use of a purely digital method. The present invention provides a purely digital correction method and a predictable number of LUT operations making HW implementations of the algorithm efficient.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1 is a schematic and very simplified illustration of how an input word is divided into two parts, according to an embodiment of the invention.

FIG. 2 is an exemplary flow diagram for calculating a corrected output word, according to an embodiment of the invention.

FIG. 3 is an exemplary flow diagram for deriving a first and second look up table, according to an embodiment of the invention.

FIG. 4 is a simplified and schematic illustration of how analog output values are obtained, according to an embodiment of the invention.

FIG. 5 is an exemplary flow diagram for updating the first look up table, according to an embodiment of the invention.

FIG. 6 is an exemplary flow diagram for scaling the input signal, according to an embodiment of the invention.

DETAILED DESCRIPTION OF THE PREFERRED EMBODIMENT

Figure 7:
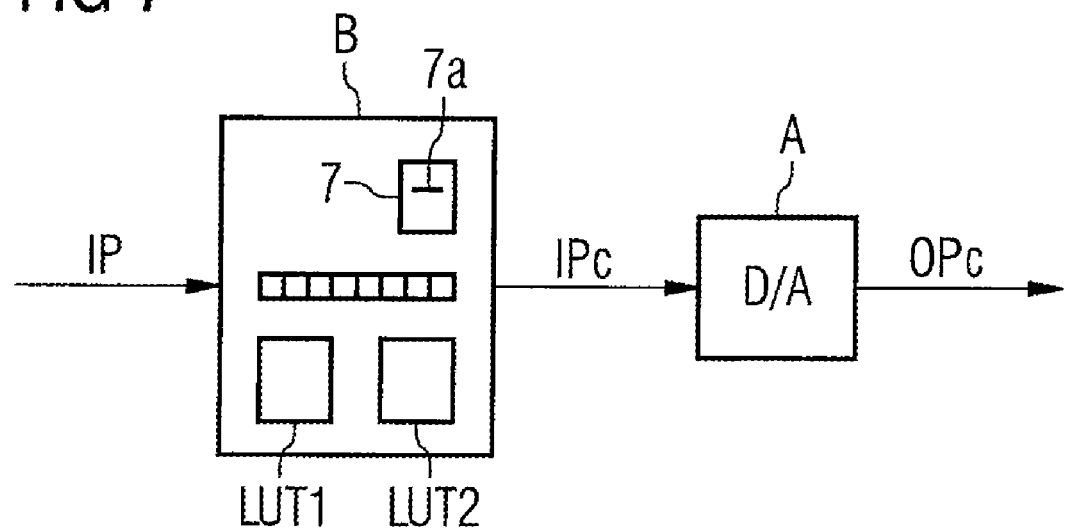
FIG. 7 is a simplified and schematic illustration of a first embodiment of an inventive device and a D/A converter, according to an embodiment of the invention.

An exemplary method for the correction of static mismatch errors in a D/A converter, according to the present invention, will now be described in with reference to FIGS. 1 and 2, showing where an input word 1, being the digital representation of an analog input signal, may be divided into one most significant part, a msb-word 11, and one least significant part, a lsb-word 12, being the first step 21 in FIG. 2. The msb-word 11 may be represented by msb-bits 111, 112, . . . 11$m$ and the lsb-word 12 may be represented by lsb-bits 121, 122, . . . 12$m$.

The second step, 22, according to the present invention is that the effective weight of the least significant msb-bit 111 may be set to be less than the total sum of all lsb-bits, 121+122+ . . . +12$m$.

The next step, 23, of an inventive method may be to implement a first look up table, LUT1, containing the most significant part of the error, so that a corrected msb-word, c-msb-word, may be equal to the msb-word plus a value in LUT1 representing the msb-word.

The next step, 24, may be to implement a second look up table, LUT2, containing the least significant part of the error, so that a first corrected output, c1-output, may be equal to c-msb-word plus a value in LUT2 representing said c-msb-word added to said lsb-word.

It is possible that a most significant bit has to be added to the first corrected output, c1-output, in order to compensate for the lower effective weight of the msb-word. Embodiments of the invention teache, in the following step 25, that if the most significant part of c1-output differs from the most significant part of c-msb-word, then a first compensation may be required.

The next step 26 according to the invention teaches that this compensation may be calculated by setting a second corrected output, c2-output, to be equal to c1-output plus the least significant bit range, $2^{lsb\text{-}bits}$, minus the difference between the values in two adjacent positions in LUT2 modulus $2^{lsb\text{-}bits}$.

At some situations yet another most significant bit may be generated by step 26, fortunately this can be corrected in the same way as described above. Thus the next step 27, shows that if the most significant part of c2-output differs from the most significant part of c1-output, then a second compensation may be required.

The next step 28 according to the present invention teaches that a third corrected output, c3-output, may be set to be equal to c2-output plus the least significant bit range, $2^{lsb\text{-}bits}$, minus the difference between the values in two adjacent positions in LUT2 modulus $2^{lsb\text{-}bits}$.

As can be seen in step 26, it is proposed that the difference between the values in two adjacent positions in LUT2 when calculating the first compensation may be set to be the difference between the value in the position representing c-msb-word and the value in the position representing c-msb-word +1.

As can be seen in step 28, it is proposed that the difference between the values in two adjacent positions in LUT2 when calculating the second compensation may be set to be the difference between the value in the position representing c-msb-word +1 and the value in the position representing c-msb-word +2.

In order to enable a correction according to the present invention two look up tables LUT1, LUT2 may be set up.

FIG. 3 is a schematic flowchart diagram showing a possible way to derive LUT1 and LUT2. The first step 31 may be to set all values in LUT1 and LUT2 to zero and setting a value for parameter n to zero.

The tables may be calculated for positions in the tables corresponding to digital values in the range from 1 to m, m being the highest value in the least significant bit range.

The next step 32 may be to increase the value for parameter n with 1.

The next step 33 may be to set the error, or deviation of an output value, DEVn, to be the difference between the expected output value, EXPn, and an actual weight for a specific digital input value, ACTn, where the expected output value, EXPn, may be equal to n times m, and the actual weight, ACTn, may be the difference between the least significant bit range, $2^{lsb\text{-}bits}$, and an analog output value OP(n+1), which analog output value OP(n+1) may be the analog output coming from the D/A converter as a response to a digital input value IP(n+1).

The following step 34 indicates that the value in position n+1 of LUT1 may be set to be the most significant bits of DEVn, and the step after that indicates that the value in position n+1 of LUT2 may be set to be the least significant bits of DEVn.

In step 36 it is checked if n has been stepped all the way up to m−1, if not steps 32 to 35 are repeated, if n=m−1 then the look up tables may be derived.

FIG. 4 shows schematically that the analog output values OPn may be obtained by applying a ramp of digital input values IPn at the input of the D/A converter A, and measuring the analog output value, OPn, for every digital input value, IPn, for every n in the range of 1 to m−1.

It is proposed that the analog output values OPn may be measured and stored in means for information storage, thus being available for later retrieval and use when deriving the first and second look up tables, LUT1, LUT2.

In order to save memory access it is proposed that the first look up table may be updated one more time. FIG. 5 shows schematically that this may be done by, for every n in the range of 1 to m−1.

A first step 51 may be to set n to be zero, and a second 52 step may be to set n to be n+1.

The next step 53 may be to store the value of position n+1 of LUT1 in a first storage element tmp1.

The next step 54 may be to store the sum of the value of said first storage element tmp1 and n in a second storage element tmp2.

The next step 55 may be to check if the value in the second storage element tmp2 is smaller than $2^{msb\text{-}bits}-1$, and if so then to go to the following step.

The next step 56 may be to store the value in LUT1 representing the value in said second storage element +1 in a third storage element tmp3.

The next steps 57 may be to check if the value in the first storage element tmp1 is not equal to the value of the third storage element tmp3, and if so then go to the next step.

The next step 58 may be to set the value of position n+1 in LUT1 to the value of the third storage element tmp3.

The next step 59 may be to check if n has been stepped all the way up to m−1, if not steps 52 to 58 may be repeated, if n=m−1 then the look up tables has been updated.

It might be required to scale the input signal to the D/A converter, data-in, to an adapted input signal, data-adapted, by a gain factor. FIG. 6 shows schematically that this can be one through the following steps.

A first step 61 may be to check if the input signal is in 2's complement representation, if not, then go to next step, if it is, then go to step 63.

The next step 62 may be to offset the binary code of the input signal to 2's complement conversion.

The next step 63 may be to set data-adapted to data-in times the gain factor.

The next step 64 may be to perform correction calculations according to the invention.

The next step 65 may be to check if the input signal was in 2's complement representation, if not, then go to next step, if it was, then go to step 67.

The next step 66 may be to 2's complement conversion to offset binary code.

The last step 67 may be to send data to the D/A converter.

Embodiments of the invention also relate to a device for the correction of static mismatch errors in a D/A converter.

This device will now be described with renewed reference to FIGS. 1 and 2, showing that the device may be adapted to divide an input word 1, being the digital representation of an analog input signal, into one most significant part, a msb-word 11, and one least significant part, a lsb-word 12, step 21, where the msb-word 11 is represented by msb-bits 111, 112, . . . 11m and the lsb-word 12 is represented by lsb-bits 121, 122, . . . 12m.

FIG. 7 shows a D/A converter A where the input signal IP is sent to the D/A converter A through an inventive device B. The device B may be adapted to recalculate the input signal IP so that a corrected input signal IPc is sent to the D/A converter, where the corrected input signal IPc gives a corrected analog output signal OPc that corresponds to the original input signal IP.

The inventive device B may be adapted to set the effective weight of the least significant msb-bit to be less than the total sum of all lsb-bits, step 22.

The device B comprises a first look up table, LUT1, and a second look up table, LUT2, where the first look up table contains the most significant part of the error, enabling the device to produce a corrected msb-word, c-msb-word, that is equal to the msb-word plus a value in LUT1 representing the msb-word, step 23, and that the second look up table contains the least significant part of the error, enabling the device to produce a first corrected output, c1-output, that is equal to c-msb-word plus a value in LUT2 representing the c-msb-word, all of this added to the lsb-word, step 24.

The present invention teaches that if the most significant part of c1-output differs from the most significant part of c-msb-word, step 25, then the inventive device may be adapted to set a second corrected output, c2-output, to be equal to c1-output plus the least significant bit range, $2^{lsb\text{-}bits}$, minus the difference between the values in two adjacent positions in LUT2 modulus $2^{lsb\text{-}bits}$, step 26.

Embodiments of the invention also teach that if the most significant part of c2-output differs from the most significant part of c1-output, step 27, then the inventive device may be adapted to set a third corrected output, c3-output, to be equal to c2-output plus the least significant bit range, $2^{lsb\text{-}bits}$, minus the difference between the values in two adjacent positions in LUT2 modulus $2^{lsb\text{-}bits}$, step 28.

As it is shown in step 26, it is proposed that the device may be adapted to calculate the difference between the values in two adjacent positions in LUT2 to be the difference between the value in the position representing c-msb-word and the value in the position representing c-msb-word+1 in the calculation of the second corrected output, c2-output.

As it is shown in step 28, it is proposed that the device may be adapted to calculate the difference between the values in two adjacent positions in LUT2 to be the difference between the value in the position representing c-msb-word +1 and the value in the position representing c-msb-word +2 in the calculation of the third corrected output, c3-output.

An inventive device may be set up to correct the static mismatch error from a specific D/A converter according to the flowchart diagram of FIG. 3, showing the steps of for every n in the range of 1 to m−1, steps 31, 32 and 36, m being the highest value in the least significant bit range, where the value in position n+1 of LUT1 is the most significant bits of DEVn, step 34, where the value in position n+1 of LUT2 is the least significant bits of DEVn, step 35, where DEVn is the difference between the expected output value, EXPn, and an actual weight for a specific digital input value, ACTn, step 33.

The expected output value, EXPn, may be equal to n times m, and the actual weight, ACTn, being the difference between the least significant bit range, $2^{lsb\text{-}bits}$, and the analog output value OP(n+1), which analog output value OP(n+1) may be the analog output coming from a specific D/A converter as a response to a digital input value IP(n+1).

The analog output values for OPn for the specific D/A converter A may be retrieved from different sources. One proposed embodiment shows that the device B comprises means for information storage B1, such as on-chip fuses, where the analog output values, OPn, are stored and available for the deriving of the first and second look up table, LUT1, LUT2.

Figure 8:
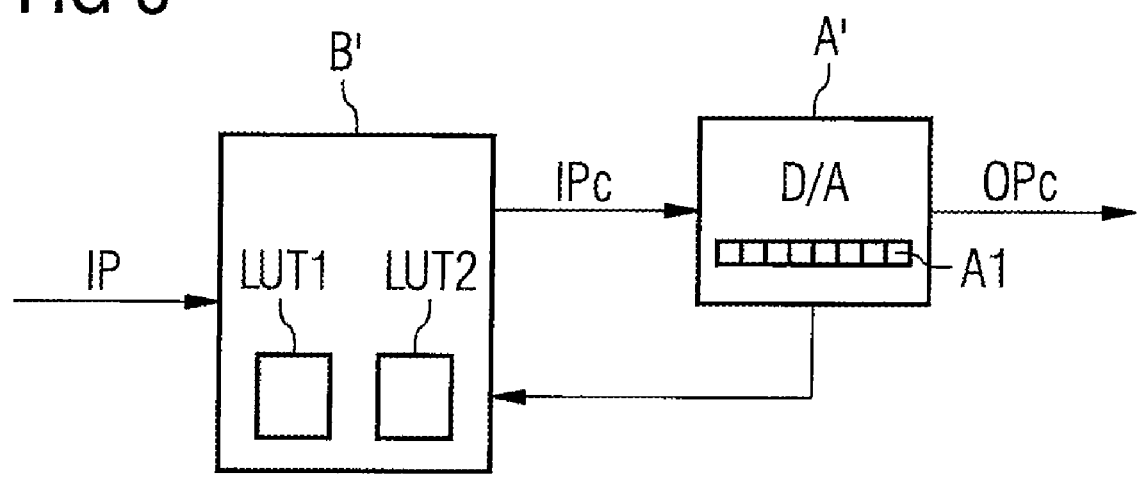
FIG. 8 is a simplified and schematic illustration of a second embodiment of an inventive device and a D/A converter, according to an embodiment of the invention.

It is also possible that the D/A converter A', as shown in FIG. 8, comprises means for information storage A1, such as on-chip fuses, where the analog output values, OPn, are stored and available for the deriving of the first and second look up table, LUT1, LUT2 by a device B'.

The present invention shows that the device A may be adapted to update LUT1 one more time according to the flowchart diagram of FIG. 5, showing the steps of, for every n in the range of 1 to m−1, steps 51, 52 and 59, store the value of position n+1 of LUT1 in a first storage element, step 52, store the sum of the value of said first storage element and n in a second storage element, step 54, if the value in said second storage element is smaller than $2^{msb\text{-}bits}-1$, then store the value in LUT1 representing the value in said second storage element +1 in a third storage element, steps 55 and 56, and if the value in said first storage element is not equal to the value of said third storage element, then set the value of position n+1 in LUT1 to the value of said third storage element, steps 57 and 58.

In some embodiments, the inventive device may be adapted to scale the input signal to the D/A converter, data-in, to an adapted input signal, data-adapted, by a gain factor, the device thus may be adapted to:

offset the binary code of the input signal to 2's complement conversion if the input signal is not in 2's complement representation, steps 61 an 62, set said data-adapted to data-in times said gain factor, step 63, perform the inventive correction calculations, step 64, 2's complement convert to offset binary code if the input signal was not in 2's complement representation, steps 65 and 66, and send the data to D/A converter, step 67, according to the flowchart diagram of FIG. 6.

Figure 9:
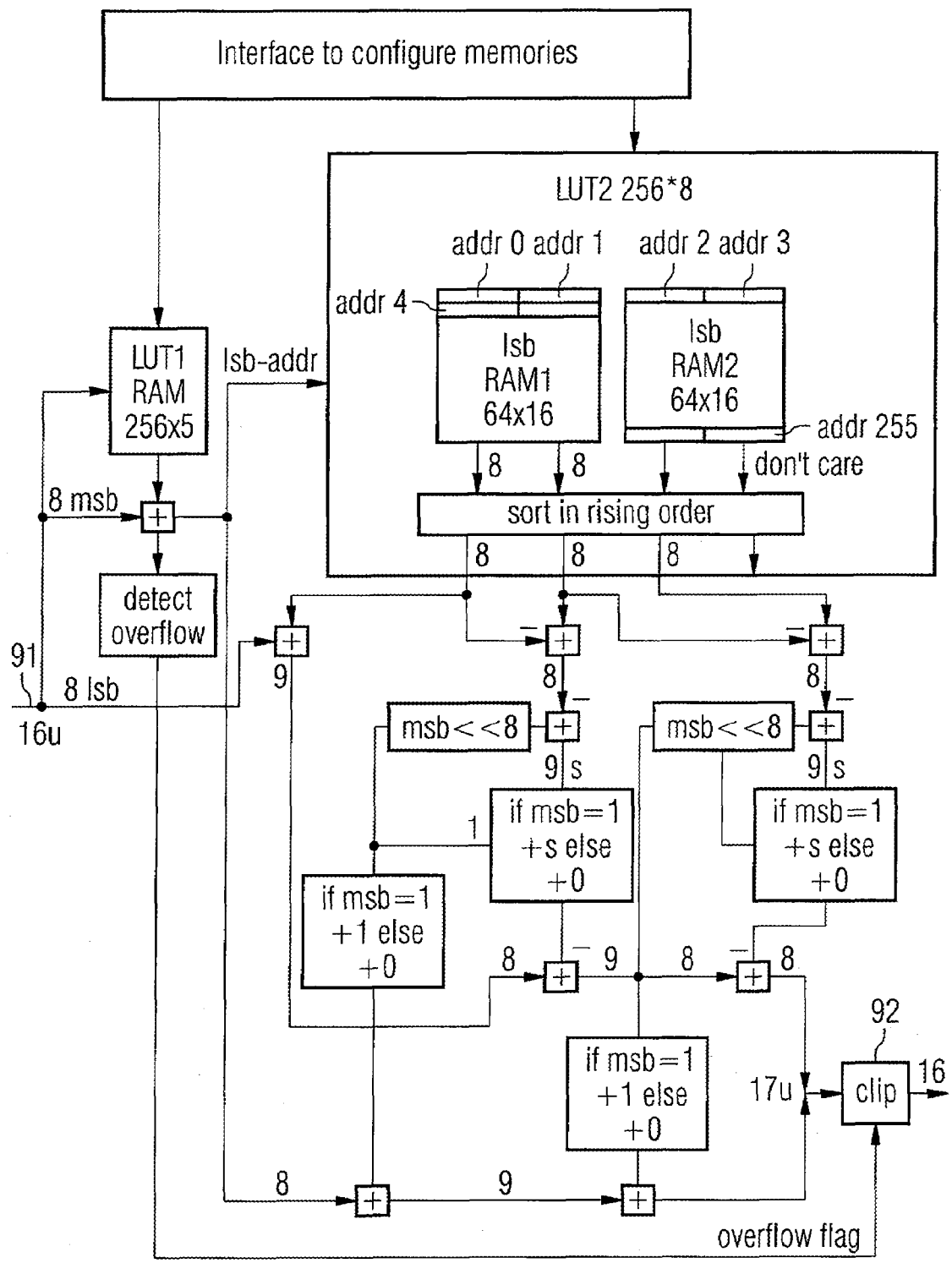
FIG. 9 illustrates an exemplary system according to an embodiment of the invention.

An implementation example will now be presented with reference to FIG. 9 showing the recalculation of words for weights errors in msbs. Since the invention considers the recalculation, the implementation example covers this case.

In FIG. 9 an example realizing the invention is shown. The input 91 may be a 16 bit offset binary code. The clip condition 92 may be set to clip if input require more than 16 bit or if the overflow flag is set. It should be noticed that LUT2 may be organised as two RAMs each two words wide. In this way it is possible to by one table look up, look up LUT2(c-msb-word), LUT2(c-msb-word+1), and LUT2(c-msb-word+2).

The LUT2 address logic algorithm may be:

If the LUT2 table address (lsb-addr<7:0>) bit 1 is zero the value of LUT2(c-msb-word) is in LUT2-RAM1(lsb-addr<7:1>) and LUT2-RAM2 contains LUT2(c-msb-word+2) and possibly LUT2(c-msb-word+1).

If lsb-addr<1> is one the value of LUT2(c-msb-word) is in LUT2-RAM2(lsb-addr<7:1>) and at least the LUT2 (c-msb-word+2) is found in lsb-addr<7:1>+1.

The exemplary table below lists possible cases using our example configuration again.

TABLE 2

Address generation of LUT2.

| lsb-addr<1:0> | where to find LUT2(c-msb-word) | where to find LUT2(c-msb-word + 1) | where to find LUT2(c-msb-word + 2) |
|---|---|---|---|
| 00 | RAM1 address lsb-addr<7:1> bits 15:8 | RAM1 address lsb-addr<7:1> bits 7:0 | RAM2 address lsb-addr<7:1> bits 15:8 |
| 01 | RAM1 address lsb-addr<7:1> bits 7:0 | RAM2 address lsb-addr<7:1> bits 15:8 | RAM2 address lsb-addr<7:1> bits 7:0 |
| 10 | RAM2 address lsb-addr<7:1> bits 15:8 | RAM2 address lsb-addr<7:1> bits 7:0 | RAM1 address lsb-addr<7:1> + 1 bits 15:8 |
| 11 | RAM2 address lsb-addr<7:1> bits 7:0 | RAM1 address lsb-addr<7:1> + 1 bits 15:8 | RAM1 address lsb-addr<7:1> + 1 bits 7:0 |

It is proposed that in order to get the addresses in right order for the recalculation the output from the look up in LUT2 may be sorted in address order.

It should be understood that the present invention also may be implemented as a computer program. Hence the present invention also relates to a computer program product comprising computer program code, which, when executed by a computer, will enable the computer to perform a correction of static mismatch errors in a D/A converter according to the inventive method.

An inventive computer program product 7 may also comprise computer program code 7a, which, when executed by a computer, will enable the computer to act as an inventive device B for the correction of static mismatch errors in a D/A converter.

The present invention also relates to a computer readable medium comprising inventive computer program code.

While the foregoing is directed to embodiments of the present invention, other and further embodiments of the invention may be devised without departing from the basic scope thereof, and the scope thereof is determined by the claims that follow.

What is claimed is:

1. A method for correction of static mismatch errors in a D/A converter, wherein an input word, the input word being a digital representation of an analog input signal, is divided into one most significant part, a msb-word, and one least significant part, a lsb-word, and wherein said msb-word is represented by msb-bits and said lsb-word is represented by lsb-bits, comprising:

setting an effective weight of the least significant msb-bit to be less than a sum of the lsb-bits;

implementing a first look up table, LUT1, containing a most significant part of the error, so that a corrected msb-word, c-msb-word, would be equal to a sum of said msb-word and a value in LUT1 representing said msb-word; and implementing a second look up table, LUT2, containing a least significant part of the error, so that a first corrected output, c1-output, would be equal to a sum of c-msb-word and a value in LUT2 representing said sum of c-msb-word and said lsb-word.

2. The method of claim 1, wherein, if a most significant part of c1-output differs from a most significant part of c-msb-word, then a second corrected output, c2-output, is set to be a sum of c1-output and a least significant bit range, 2lsb-bits, minus a difference between values in two adjacent positions in LUT2 modulus 2lsb-bits.

3. The method of claim 2, wherein, if the most significant part of c2-output differs from the most significant part of c1-output, then a third corrected output, c3-output, is set to be equal to c2-output plus the least significant bit range, 2lsb-bits, minus the difference between the values in two adjacent positions in LUT2 modulus 2lsb-bits.

4. The method of claim 2, wherein the difference between the values in two adjacent positions in LUT2 is set to be a difference between a value in a position representing c-msb-word and a value in a position representing c-msb-word +1.

5. The method of claim 3, wherein the difference between the values in two adjacent positions in LUT2 is set to be a difference between a value in a position representing c-msb-word +1 and a value in a position representing c-msb-word +2.

6. The method of claim 2, further comprising deriving said LUT1 and LUT2 by setting all values in LUT1 and LUT2 to zero and then, for every n in a range of 1 to m-1, m being a highest value in a least significant bit range:

setting the error, or deviation, of an output value, DEVn, to be a difference between an expected output value, EXPn, and an actual weight for a specific digital input value, ACTn, said expected output value, EXPn, being equal to n times m, and said actual weight, ACTn, being a difference between the least significant bit range, 2lsb-bits, and an analog output value OP(n+1), said analog output value OP(n+1) being an analog output coming from said D/A converter as a response to a digital input value IP(n+1);

setting a value in position n+1 of LUT1 to be the most significant bits of DEVn; and setting a value in position n+1 of LUT2 to be the least significant bits of DEVn.

7. The method of claim 6, further comprising obtaining said analog output values by applying a ramp of digital input values IPn at an input of said D/A converter, and measuring the analog output value, OPn, for every digital input value, IPn, for every n in the range of 1 to m-1, m being the highest value in the least significant bit range.

8. The method of claim 7, wherein said analog output values OPn are measured and stored in means for information storage, thus being available for later retrieval and use when deriving said first and second look up tables, LUT1, LUT2.

9. The method of claim 6, further comprising updating LUT1 one more time by, for every n in the range of 1 to m-1, storing the value of position n+1 of LUT1 in a first storage element;

storing a sum of the value of said first storage element and n in a second storage element;

if the value in said second storage element is smaller than 2msb-bits-1, then storing the value in LUT1 representing the value in said second storage element +1 in a third storage element; and if the value in said first storage element is not equal to the value of said third storage element, then setting the value of position n+1 in LUT1 to the value of said third storage element.

10. The method according to any one of claims 1-9, further comprising scaling the input signal to said D/A converter, data-in, to an adapted input signal, data-adapted, by a gain factor, by:

if the input signal is not in 2's complement representation, then offset a binary code of the input signal to 2's complement conversion;

set said data-adapted to a product of data-in and said gain factor;

perform correction calculations;

if the input signal was not in 2's complement representation, then perform 2's complement conversion to offset binary code; and send data to D/A converter.

11. A device for correction of static mismatch errors in a D/A converter, said device being adapted to divide an input word, the input word being the digital representation of an analog input signal, into one most significant part, a msb-word, and one least significant part, a lsb-word, wherein said msb-word is represented by msb-bits and said lsb-word is represented by lsb-bits, wherein, said device is adapted to set an effective weight of a least significant msb-bit to be less than a sum of lsb-bits, said device comprising a first look up table, LUT1, and a second look up table, LUT2, said first look up table containing a most significant part of the error, enabling said device to produce a corrected msb-word, c-msb-word, that is equal to said msb-word plus a value in LUT1 representing said msb-word, and said second look up table containing a least significant part of the error, enabling said device to produce a first corrected output, c1-output, that is equal to c-msb-word plus a value in LUT2 representing said c-msb-word added to said lsb-word.

12. The device of claim 11, wherein if a most significant part of c1-output differs from a most significant part of c-msb-word, then said device is adapted to set a second corrected output, c2-output, to be equal to c1-output plus a least significant bit range, 2lsb-bits, minus a difference between values in two adjacent positions in LUT2 modulus 2lsb-bits.

13. The device of claim 12, wherein if a most significant part of c2-output differs from the most significant part of c1-output, then said device is adapted to set a third corrected output, c3-output, to be equal to c2-output plus the least significant bit range, 2lsb-bits, minus the difference between the values in two adjacent positions in LUT2 modulus 2lsb-bits.

14. The device of claim 12, wherein said device is adapted to calculate said difference between the values in two adjacent positions in LUT2 to be a difference between a value in the position representing c-msb-word and a value in a position representing c-msb-word +1.

15. The device of claim 13, wherein said device is adapted to calculate said difference between the values in two adjacent positions in LUT2 to be a difference between a value in the position representing c-msb-word +1 and a value in a position representing c-msb-word +2.

16. The device of claim 12, wherein, for every n in a range of 1 to m-1, m being a highest value in the least significant bit range, a value in position n+1 of LUT1 is the most significant bits of DEVn, a value in position n+1 of LUT2 is the least significant bits of DEVn, DEVn is a difference between the expected output value, EXPn, and an actual weight for a specific digital input value, ACTn, said expected output value, EXPn, being equal to n times m, and said actual weight, ACTn, being a difference between the least significant bit range, 2lsb-bits, and an analog output value OP(n+1), said analog output value OP(n+1) being an analog output coming from a specific D/A converter as a response to a digital input value IP(n+1), whereby said device is set to correct the static mismatch error from said specific D/A converter.

17. The device of claim 16, wherein said device comprises means for information storage, such as on-chip fuses, where said analog output values, OPn, are stored and available for the deriving of said first and second look up table, LUT1, LUT2.

18. The device of claim 16, wherein LUT1 in said device is updated one more time, by said device being adapted to, for every n in the range of 1 to m-1:
  store a value of position n+1 of LUT1 in a first storage element;
  store a sum of the value of said first storage element and n in a second storage element;
  if the value in said second storage element is smaller than 2msb-bits-1, then store a value in LUT1 representing the value in said second storage element +1 in a third storage element; and
  if the value in said first storage element is not equal to the value of said third storage element, then set the value of position n+1 in LUT1 to the value of said third storage element.

19. The device according to claim 11, wherein said device is adapted to scale the input signal to said D/A converter, data-in, to an adapted input signal, data-adapted, by a gain factor, said device being adapted to:
  offset a binary code of the input signal to 2's complement conversion if the input signal is not in 2's complement representation;
  set said data-adapted to a product of data-in and said gain factor;
  perform correction calculations;
  perform 2's complement conversion to offset the binary code if the input signal was not in 2's complement representation; and
  send the data to the D/A converter.

20. A digital to analog (D/A) converter according to claim 16, wherein said D/A converter comprises on-chip fuses, where said analog output values, OPn, are stored and available for the deriving of said first and second look up table, LUT1, LUT2 by the device.

21. A computer readable storage medium comprising computer program code, which, when executed by a computer, will enable said computer to perform a correction of static mismatch errors in a D/A converter according to claim 1.

22. A computer readable storage medium comprising computer program code, which, when executed by a computer, will enable said computer to act as a device for the correction of static mismatch errors in a D/A converter according to claim 11.

23. A computer readable storage medium comprising computer program code, which, when executed by a computer, will enable said computer to perform a correction of static mismatch errors in a D/A converter according to claim 2.

24. A computer readable storage medium comprising computer program code, which, when executed by a computer, will enable said computer to perform a correction of static mismatch errors in a D/A converter according to claim 3.

25. A computer readable storage medium comprising computer program code, which, when executed by a computer, will enable said computer to perform a correction of static mismatch errors in a D/A converter according to claim 4.

26. A computer readable storage medium comprising computer program code, which, when executed by a computer, will enable said computer to perform a correction of static mismatch errors in a D/A converter according to claim 5.

27. A computer readable storage medium comprising computer program code, which, when executed by a computer, will enable said computer to perform a correction of static mismatch errors in a D/A converter according to claim 6.

28. A computer readable storage medium comprising computer program code, which, when executed by a computer, will enable said computer to perform a correction of static mismatch errors in a D/A converter according to claim 7.

29. A computer readable storage medium comprising computer program code, which, when executed by a computer, will enable said computer to perform a correction of static mismatch errors in a D/A converter according to claim 8.

30. A computer readable storage medium comprising computer program code, which, when executed by a computer, will enable said computer to perform a correction of static mismatch errors in a D/A converter according to claim 9.

31. A computer readable storage medium comprising computer program code, which, when executed by a computer, will enable said computer to perform a correction of static mismatch errors in a D/A converter according to claim 10.

32. A computer readable storage medium comprising computer program code, which, when executed by a computer, will enable said computer to act as a device for the correction of static mismatch errors in a D/A converter according to claim 12.

33. A computer readable storage medium comprising computer program code, which, when executed by a computer, will enable said computer to act as a device for the correction of static mismatch errors in a D/A converter according to claim 13.

34. A computer readable storage medium comprising computer program code, which, when executed by a computer, will enable said computer to act as a device for the correction of static mismatch errors in a D/A converter according to claim 14.

35. A computer readable storage medium comprising computer program code, which, when executed by a computer, will enable said computer to act as a device for the correction of static mismatch errors in a D/A converter according to claim 15.

36. A computer readable storage medium comprising computer program code, which, when executed by a computer, will enable said computer to act as a device for the correction of static mismatch errors in a D/A converter according to claim 16.

37. A computer readable storage medium comprising computer program code, which, when executed by a computer, will enable said computer to act as a device for the correction of static mismatch errors in a D/A converter according to claim 17.

38. A computer readable storage medium comprising computer program code, which, when executed by a computer, will enable said computer to act as a device for the correction of static mismatch errors in a D/A converter according to claim 18.

39. A computer readable storage medium comprising computer program code, which, when executed by a computer, will enable said computer to act as a device for the correction of static mismatch errors in a D/A converter according to claim 19.

* * * * *